United States Patent
Tian

(10) Patent No.: US 9,466,625 B2
(45) Date of Patent: Oct. 11, 2016

(54) DISPLAY PANEL, DISPLAY DEVICE, AND METHOD FOR MANUFACTURING DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lu Tian, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/487,966

(22) Filed: Sep. 16, 2014

(65) Prior Publication Data

US 2015/0228539 A1  Aug. 13, 2015

(30) Foreign Application Priority Data

Feb. 8, 2014 (CN) .......................... 2014 1 0045796

(51) Int. Cl.
| | |
|---|---|
| *H01L 27/12* | (2006.01) |
| *G02F 1/1345* | (2006.01) |
| *G02F 1/1362* | (2006.01) |
| *H01L 23/532* | (2006.01) |
| *G02F 1/1333* | (2006.01) |

(52) U.S. Cl.
CPC ......... *H01L 27/1288* (2013.01); *G02F 1/1345* (2013.01); *H01L 27/124* (2013.01); *H01L 27/1262* (2013.01); *G02F 1/133345* (2013.01); *G02F 1/136227* (2013.01); *H01L 23/53228* (2013.01); *H01L 2924/0002* (2013.01)

(58) Field of Classification Search
CPC  H01L 21/768; H01L 21/3213; G02F 1/1362
USPC ................................ 257/749, 72, 59, 40, 43
See application file for complete search history.

(56) References Cited

U.S. PATENT DOCUMENTS

| | | | |
|---|---|---|---|
| 6,674,495 B1 * | 1/2004 | Hong et al. ..................... | 349/43 |
| 2007/0139600 A1 * | 6/2007 | Lee ...................... | G02F 1/1339 |
| | | | 349/153 |

* cited by examiner

*Primary Examiner* — Chuong A Luu
*Assistant Examiner* — Rodolfo D Fortich
(74) *Attorney, Agent, or Firm* — Harness, Dickey & Pierce, P.L.C.

(57) ABSTRACT

The present disclosure relates to a display panel, a display device and a method for manufacturing the display panel. The display panel comprises an array substrate and a color film substrate, wherein the array substrate is provided with a perforated region, at least a part of which is located between a silver paste conductive layer and an outermost metal lead of the array substrate, and the silver paste conductive layer is arranged on the array substrate, and connects an ITO layer on the color film substrate and a grounded signal region of the array substrate.

18 Claims, 3 Drawing Sheets

DISPLAY PANEL, DISPLAY DEVICE, AND METHOD FOR MANUFACTURING DISPLAY PANEL

CROSS-REFERENCE TO RELATED APPLICATION

This application claims priority to Chinese Patent Application No. 201410045796.2 filed on Feb. 8, 2014, the disclosures of which are incorporated in their entirety by reference herein.

TECHNICAL FIELD

The present invention relates to the field of display technology, in particular to a display panel, a display device, and a method for manufacturing a display panel.

BACKGROUND

A small-size thin film transistor-liquid crystal display (TFT-LCD) used for an electronic product such as a mobile phone is usually manufactured by: arranging a color film substrate and an array substrate opposite to each other to form a cell; cutting a mother board, i.e., a glass substrate, into a Q-panel; plating indium tin oxide (ITO) onto a surface of a color film of the Q-panel; cutting the Q-panel into a single panel; and coating a silver paste onto the single panel in the subsequent procedure of manufacturing a module.

In order to rapidly release charges accumulated at a surface of the existing small-size TFT-LCD, usually an ITO layer is plated onto the surface of the color film, and then the ITO layer is connected to a grounded signal line on the single panel by coating the silver paste. As a result, it is able to eliminate an electrostatic effect.

For a peripheral structure of the existing TFT-LCD display panel, a gate insulating (GI) layer and a passivation (PVX) layer are tiled between an outermost metal lead and a cutting edge of the single panel, without any special designs. In addition, for the small-size product, generally it is required to connect the ITO layer on the surface of the color film to the grounded signal line at the periphery of the panel by the silver paste. When the Q-panel is cut into the single panel, there will be breakage, which is hard to be seen by human eyes, at the cutting edge, and the silver paste is easily permeated at the breakage the neighborhood of the outermost metal lead of the single panel. As a result, an abnormal electrical signal is occurred and the quality of the panel is deteriorated.

SUMMARY

An object of the present disclosure is to prevent a silver paste from permeating the neighborhood of a metal lead when coating the silver paste onto a display panel, thereby to prevent the occurrence of an abnormal electrical signal.

In one aspect, the present disclosure provides a display panel, comprising an array substrate and a color film substrate. The array substrate is provided with a perforated region, at least a part of which is located between a silver paste conductive layer and an outermost metal lead of the array substrate. The silver paste conductive layer is arranged on the array substrate, and connects an ITO layer on the color film substrate and a grounded signal region of the array substrate.

Alternatively, the perforated region includes a plurality of holes for storing a superfluous silver paste from the silver paste conductive layer.

Alternatively, the outermost metal lead of the array substrate is a lead for a gate electrode or a lead for a data line.

Alternatively, the perforated region includes the plurality of holes for storing the superfluous silver paste from the silver paste conductive layer and a channel for the drainage of the superfluous silver paste. The plurality of holes is arranged at a bottom of the channel.

Alternatively, at least a part of the holes is arranged between the outermost metal lead and an edge of the array substrate.

Alternatively, the holes are located adjacent to, but not connected to, the outermost metal lead of the array substrate.

Alternatively, the holes penetrate through a gate insulating layer and a passivation layer of the array substrate, and end at a substrate of the array substrate.

Alternatively, the holes penetrate through a passivation layer of the array substrate or a part of the passivation layer.

Alternatively, the holes penetrate through a part of a gate insulating layer and a passivation layer of the array substrate.

Alternatively, the grounded signal region is in a form of pad.

In another aspect, the present disclosure provides a display device comprising the above-mentioned display panel.

In yet another aspect, the present disclosure provides a method for manufacturing a display panel comprising an array substrate and a color film substrate. The method comprises a step of forming a perforated region prior to arranging a silver paste conductive layer. The silver paste conductive layer is arranged on the array substrate, and connects an ITO layer on the color film substrate and a grounded signal region of the array substrate. At least a part of the perforated region is located between the silver paste conductive layer and an outermost metal lead of the array substrate.

Alternatively, the perforated region is formed by a via-hole mask process and a via-hole etching process.

As compared with the prior art, the present disclosure has the following advantages. A perforated region is arranged on the array substrate, so as to prevent the silver paste at the silver paste conductive layer from permeating the neighborhood of the outermost metal lead of the array substrate, thereby to prevent the occurrence of an abnormal electrical signal due to a capacitance effect and ensure the quality of the display panel.

DETAILED DESCRIPTION

The present invention will be described hereinafter in conjunction with the drawings and the embodiments. The following embodiments are for illustrative purposes only, but shall not be used to limit the scope of the present invention.

Figure 1:
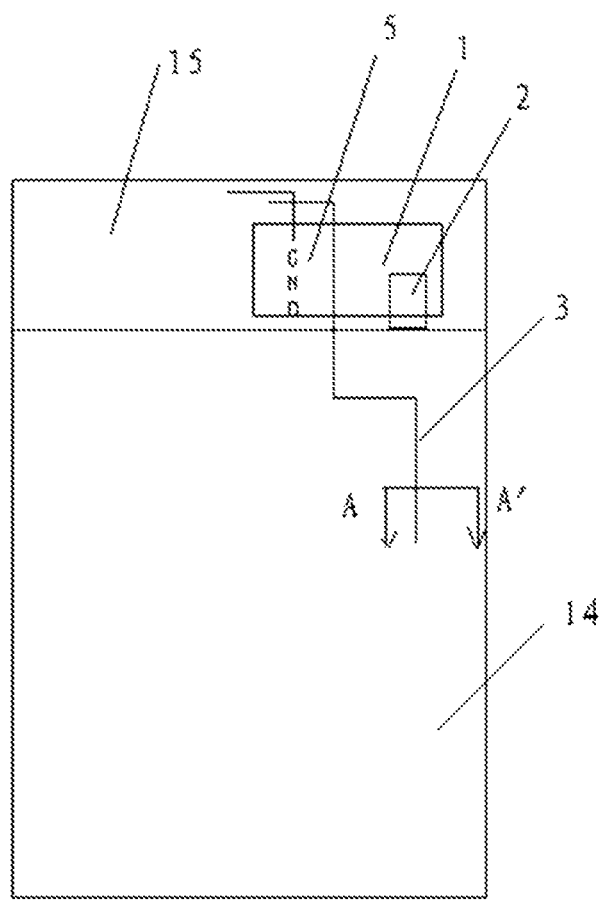
FIG. 1 is a schematic view showing an existing display panel.
Figure 3:
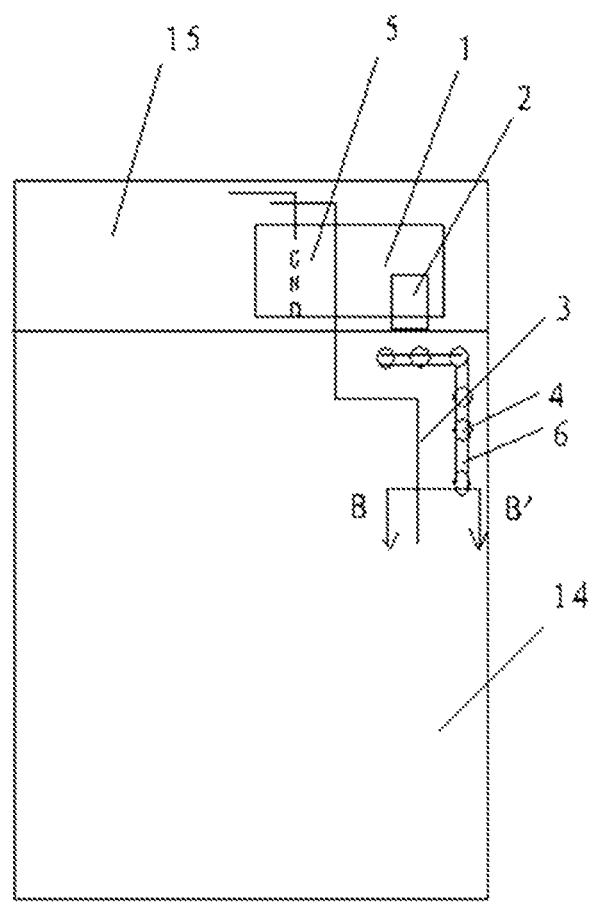
FIG. 3 is a schematic view showing a display panel according to an embodiment of the present invention.

It is to be noted that, FIGS. 1 and 3 are top views of display panels when viewed from a side of a color film substrate 14. The color film substrate 14 is arranged directly opposite to an array substrate 15 and the color film substrate 14 is arranged above the array substrate 15. One end of the array substrate 15 is not covered by the color film substrate 14. For convenience, the part of the array substrate 15 covered by the color film substrate 14 is made visible through the color film substrate 14. In other words, the drawings are merely used to illustratively show the position relationship between the color film substrate 14 and the array substrate 15 as well as the size thereof, rather than to define the specific structure thereof.

FIG. 1 is a schematic view showing an existing display panel. The display panel comprises the array substrate 15 and the color film substrate, which are arranged opposite to each other to form a cell. An end of the array substrate 15 is not covered by the color film substrate 14, which is usually realized by cutting off a part of the color film substrate 14. As shown in FIG. 1, the end of the array substrate not covered by the color film substrate 14 has a grounded signal region 5 (GND in FIG. 1), the grounded signal region 5 is connected to a grounded wire. The grounded signal region 5 may be, for example, in a form of a pad. For example, an ITO layer 1 may be arranged beside the grounded signal region 5, so as to be connected with the grounded signal region 5. At this time, the ITO layer 1 actually constitutes a part of the grounded signal region. A silver conductive layer 2 is arranged on the array substrate and connects the ITO layer (which is not shown in FIG. 1 but is just coated onto a surface of the color film substrate) and the grounded signal region 5 of the array substrate 15.

FIG. 3 is a schematic view showing a display panel according to an embodiment of the present invention. By comparing FIG. 1 with FIG. 3, an improvement of the embodiment of the present invention lies in a perforated region 6 arranged on the array substrate 15. At least a part of the perforated region 6 is located between the silver paste conductive layer 2 and an outermost metal lead 3 of the array substrate 15, so as to prevent a silver paste at the silver paste conductive layer 2 from permeating the neighborhood of the outermost metal lead 3. The outermost metal lead may be, for example, a lead for a gate electrode, a lead for a data line, or any other signal line for an external signal.

As shown in FIG. 3, the perforated region 6 includes a plurality of holes 4 for storing the superfluous silver paste from the silver paste conductive layer 2 and a channel for the drainage of the paste silver in the silver paste conductive layer 2. The plurality of holes 4 are located at a bottom of the channel, and at least a part of the holes 4 is arranged between the outermost metal lead 3 of the array substrate 15 and an edge of the array substrate 15.

Figure 2:
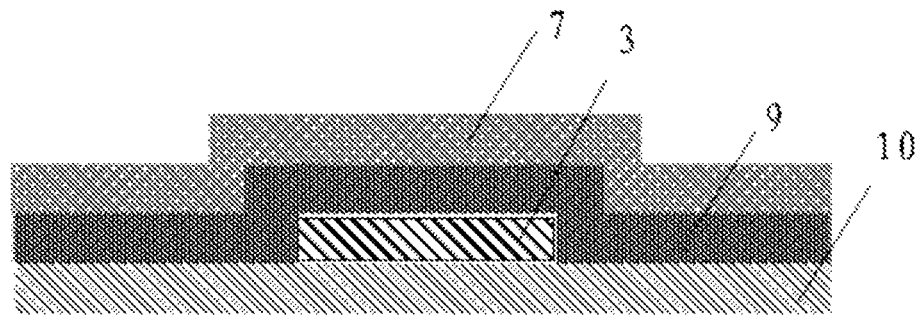
FIG. 2 is a sectional view of the array substrate in FIG. 1 along line A-A'.
Figure 4:
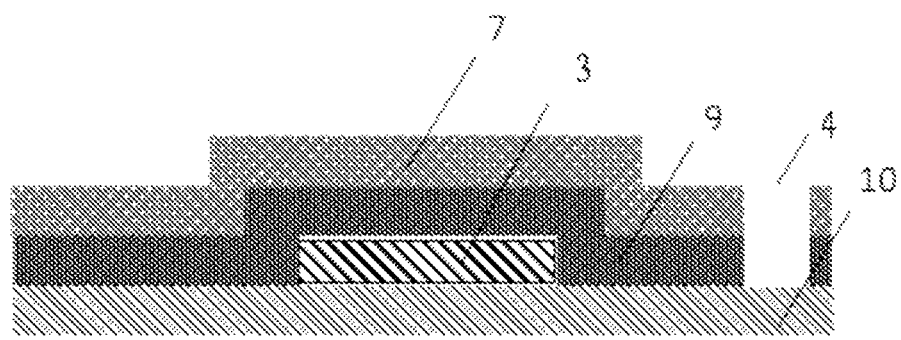
FIG. 4 is a sectional view of the array substrate in FIG. 2 along line B-B'.

FIG. 2 is a sectional view showing the array substrate in FIG. 1 along line A-A', and FIG. 4 is a sectional view showing the array substrate in FIG. 3 along line B-B'. The difference therebetween is that, in FIG. 2 there is no hole, while in FIG. 4 the holes 4 penetrate through a gate insulating (GI) layer 9 and a passivation (PVX) layer 7 on the array substrate 15 and end at a substrate 10 of the array substrate 15. Of course, the pore may merely penetrate through the passivation layer 7, a part of the passivation layer 7 or through the passivation layer 7 and a part of the gate insulating layer 9, as long as a bottom of the hole is below a surface of the passivation layer 7 so as to receive a part of the silver paste. FIG. 4 merely shows the array substrate where the gate insulating layer 9 and the passivation layer 7 are sequentially arranged on the substrate 10. Of course, some other layers may also be arranged on the substrate 10, and the hole may penetrate one, more, or some of these layers. These structural variants are not particularly defined in the present invention.

According to the display panel of an embodiment of the present invention, the perforated region is arranged on the array substrate, so as to prevent the silver paste at the silver paste conductive layer from permeating the neighborhood of the outermost metal lead of the array substrate, thereby to prevent the occurrence of an abnormal electrical signal due to a capacitance effect and ensure the quality of the display panel. Even if the edge of the display panel is damaged when cutting, silver paste cannot permeate the neighborhood of the outermost metal lead of the array substrate 15 when coating the silver paste.

Another embodiment of the present invention further provides a display device comprising the above-mentioned display panel. Of course, the display device may comprise other elements capable of implementing a display function, which will not be repeated herein.

The present invention further provides a method for manufacturing the above-mentioned display panel comprising an array substrate and a color film substrate. The method comprises a step of forming a perforated region prior to arranging a silver paste conductive layer. The silver paste conductive layer is arranged on the array substrate and connects an ITO layer on the color film substrate and a grounded signal region of the array substrate. At least a part of the perforated region is arranged between the silver paste conductive layer and an outermost metal lead of the array substrate. During the manufacture, the perforated region is formed prior to arranging the silver paste conductive layer. The perforated region is formed by a via-hole mask process and a via-hole etching process, e.g., by a 4Mask or 5Mask process. To be specific, a pattern of the perforated region is formed by a PVX via-hole mask process, and then the final perforated region is formed by a PVX etching process. The other processes for manufacturing the perforated region may be those mentioned in the prior art, which will not be repeated herein. Of course, the perforated region may be formed simultaneously when the other layers are formed by a mask process, or by a separate mask process, or by the other patterning processes, which will not be particularly defined in the present invention.

The above are merely the preferred embodiments of the present invention, but are not used to limit the present invention. A person skilled in the art may make further modifications and alterations without departing from the spirit of the present invention, and all these equivalents also fall within the scope of the present invention. The scope of the present application shall be subjected to the appended claims.

What is claimed is:

1. A display panel, comprising an array substrate and a color film substrate oppositely arranged to each other to form a cell, wherein the array substrate is provided with a perforated region, at least a part of the perforated region is located between a silver paste conductive layer and an outermost metal lead of the array substrate, and the silver paste conductive layer is arranged on the array substrate, and connects an indium tin oxide (ITO) layer on the color film substrate to a grounded signal region of the array substrate, wherein the perforated region comprises a plurality of holes for storing a superfluous silver paste from the silver paste conductive layer and a channel for a drainage of the superfluous silver paste, and the plurality of holes is arranged at a bottom of the channel.

2. The display panel according to claim 1, wherein the perforated region comprises a plurality of holes for storing a superfluous silver paste from the silver paste conductive layer.

3. The display panel according to claim 1, wherein the outermost metal lead of the array substrate is a lead for a gate electrode or a lead for a data line.

4. The display panel according to claim 1, wherein at least a part of the holes is arranged between the outermost metal lead and an edge of the array substrate.

5. The display panel according to claim 4, wherein the holes are located adjacent to, but not connected to, the outermost metal lead of the array substrate.

6. The display panel according to claim 4, wherein the holes penetrate through a gate insulating layer and a passivation layer of the array substrate, and end at a substrate of the array substrate.

7. The display panel according to claim 4, wherein the holes penetrate through a passivation layer of the array substrate or a part of the passivation layer.

8. The display panel according to claim 4, wherein the holes penetrate through a part of a gate insulating layer and a passivation layer of the array substrate.

9. The display panel according to claim 4, wherein the grounded signal region is in a form of pad.

10. The display panel according to claim 1, wherein the holes are located adjacent to, but not connected to, the outermost metal lead of the array substrate.

11. A display device comprising the display panel according to claim 1.

12. The display device according to claim 11, wherein the perforated region comprises a plurality of holes for storing a superfluous silver paste from the silver paste conductive layer.

13. The display device according to claim 11, wherein the outermost metal lead of the array substrate is a lead for a gate electrode or a lead for a data line.

14. The display device according to claim 1, wherein at least a part of the holes is arranged between the outermost metal lead and an edge of the array substrate.

15. The display device according to claim 14, wherein the holes are located adjacent to, but not connected to, the outermost metal lead of the array substrate.

16. The display device according to claim 1, wherein the holes are located adjacent to, but not connected to, the outermost metal lead of the array substrate.

17. A method for manufacturing a display panel comprising an array substrate and a color film substrate oppositely arranged to each other to form a cell, wherein the array substrate is provided with a perforated region, at least a part of the perforated region is located between a silver paste conductive layer and an outermost metal lead of the array substrate, and the silver paste conductive layer is arranged on the array substrate, and connects an ITO layer on the color film substrate to a grounded signal region of the array substrate, wherein the perforated region comprises a plurality of holes for storing a superfluous silver paste from the silver paste conductive layer and a channel for a drainage of the superfluous silver paste, and the plurality of holes is arranged at a bottom of the channel, the method comprising a step of forming a perforated region prior to arranging a silver paste conductive layer.

18. The method according to claim 17, wherein the perforated region is formed by a via-hole mask process and a via-hole etching process.

* * * * *